US009030242B2

(12) United States Patent
Kim (10) Patent No.: US 9,030,242 B2
(45) Date of Patent: May 12, 2015

(54) DATA OUTPUT TIMING CONTROL CIRCUIT FOR SEMICONDUCTOR APPARATUS

(71) Applicant: SK Hynix Inc., Icheon-si Gyeonggi-do (KR)

(72) Inventor: Kyung Hoon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/495,014

(22) Filed: Sep. 24, 2014

(65) Prior Publication Data

US 2015/0009748 A1  Jan. 8, 2015

Related U.S. Application Data

(62) Division of application No. 13/601,661, filed on Aug. 31, 2012, now Pat. No. 8,872,557.

(30) Foreign Application Priority Data

Feb. 20, 2012  (KR) .................. 10-2012-0017103

(51) Int. Cl.
*G11C 7/22* (2006.01)
*G11C 7/10* (2006.01)

(52) U.S. Cl.
CPC .............. *G11C 7/22* (2013.01); *G11C 7/1066* (2013.01); *G11C 7/222* (2013.01); *G11C 2207/2254* (2013.01); *G11C 7/1063* (2013.01)

(58) Field of Classification Search
CPC ...... G11C 7/1063; G11C 7/1066; G11C 7/22; G11C 7/222
USPC ......... 327/149, 153, 158, 161, 231, 237, 241; 365/191, 194, 233.1; 713/400, 401
See application file for complete search history.

(56) References Cited

U.S. PATENT DOCUMENTS

| 6,778,465 | B2 * | 8/2004 | Shin ........................... 365/233.1 |
| 7,944,772 | B2 * | 5/2011 | Ahn et al. ................. 365/233.1 |
| 8,030,981 | B2 * | 10/2011 | Kim ............................... 327/284 |
| 8,392,741 | B2 * | 3/2013 | Kim et al. ..................... 713/401 |
| 8,446,785 | B2 * | 5/2013 | Park et al. ..................... 365/194 |
| 8,872,557 | B2 * | 10/2014 | Kim ............................... 327/158 |
| 8,909,972 | B2 * | 12/2014 | Kim et al. ..................... 713/500 |
| 2012/0140869 | A1 * | 6/2012 | Choi ............................... 377/2 |
| 2012/0194240 | A1 * | 8/2012 | Kim et al. ..................... 327/158 |

* cited by examiner

*Primary Examiner* — Patrick O'Neill
(74) *Attorney, Agent, or Firm* — William Park & Associates Ltd.

(57) ABSTRACT

A data output timing control circuit for a semiconductor apparatus includes a phase adjustment unit. The phase adjustment unit is configured to shift a phase of a read command as large as a code value of the delay control code in sequential synchronization with a plurality of delayed clocks obtained by delaying the external clock as large as predetermined delay amounts, respectively, delay the shifted read command as large as the variable delay amount, and output the result of delay as an output enable flag signal.

7 Claims, 6 Drawing Sheets

DATA OUTPUT TIMING CONTROL CIRCUIT FOR SEMICONDUCTOR APPARATUS

CROSS-REFERENCES TO RELATED APPLICATION

The present application claims priority under 35 U.S.C. §119(a) to Korean application number 10-2012-0017103 filed on Feb. 20, 2012, in the Korean Intellectual Property Office, which is incorporated herein by reference in its entirety as set forth in full.

BACKGROUND

1. Technical Field

The present invention relates to a semiconductor apparatus, and more particularly, to a data output timing control circuit.

2. Related Art

A semiconductor apparatus is configured to operate through a clock synchronous system to match the operation timing and ensure much faster operation without occurrence of errors. If an external clock is used inside the semiconductor apparatus, time delay (clock skew) due to an internal circuit occurs in output data. Accordingly, a delay locked loop is provided to generate a DLL clock includes a compensation for a model delay value tREF that is obtained by modeling a delay amount of an internal circuit of the semiconductor apparatus, that is, a path through which data is output. By using the DLL clock in the semiconductor apparatus, data can be output outside the semiconductor apparatus in synchronization with the external clock.

On the other hand, in the semiconductor apparatus, a time point when data is output outside the semiconductor apparatus is determined in accordance with data output delay information (CAS latency) during a read operation. The data output delay information indicates a number of clock cycles after which first data is output after receiving an external read command which is input based on an external clock. A data output timing control circuit is a circuit that is separately provided inside the semiconductor apparatus so that data can be output to match the data output delay information.

The purpose of the data output timing control circuit is to output the first data to the outside at a rising edge of the set external clock, and for this, the data output timing control circuit generates an output enable flag signal for controlling the data output time. The output enable flag signal is an internal signal of the semiconductor apparatus which is synchronized with the DLL clock.

Figure 1:
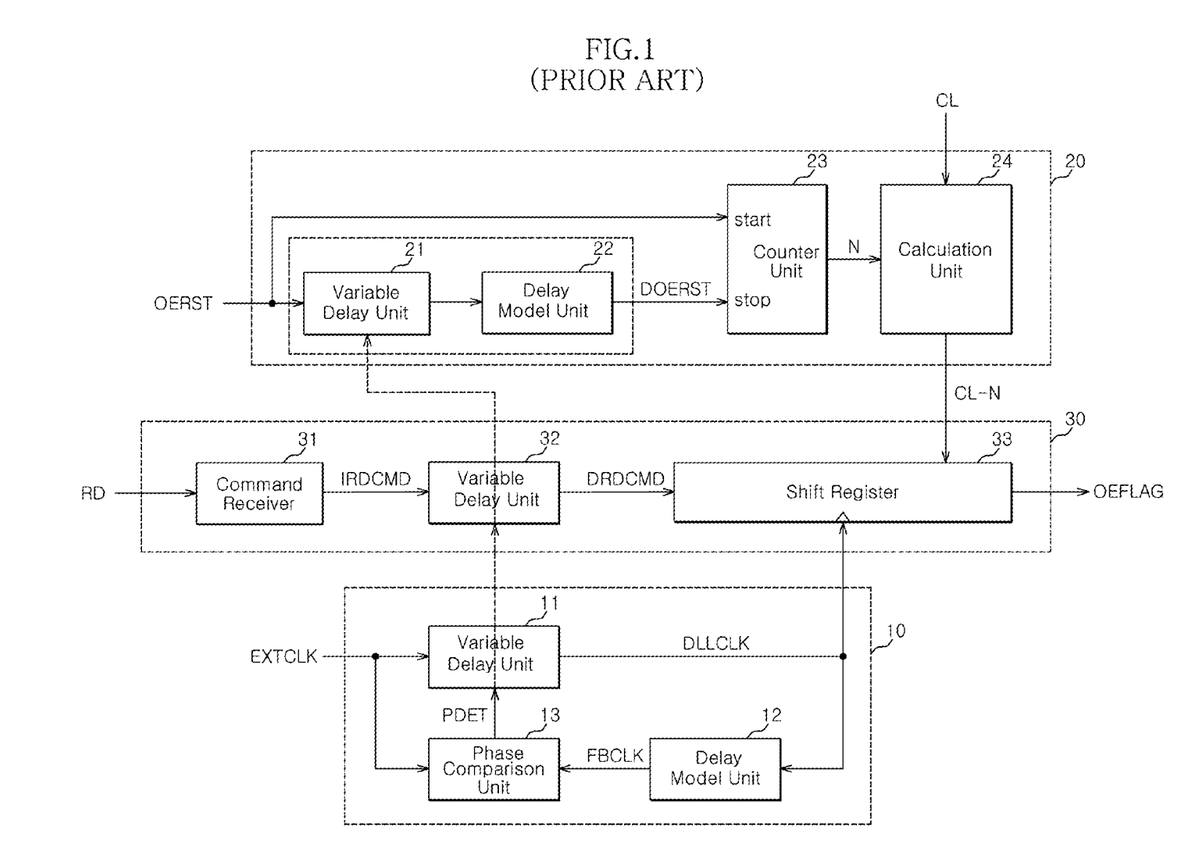
FIG. 1 is a block diagram of a data output timing control circuit for a semiconductor apparatus in the related art.

FIG. 1 is a block diagram of a data output timing control circuit in the related art.

The data output timing control circuit of the related art shown in FIG. 1 includes a delay locked loop 10, a delay amount calculation unit 20, and a phase adjustment unit 30.

The delay locked loop 10 is configured to receive the external clock EXTCLK, and generate a DLL clock DLLCLK through delay of the external clock for n*tCK−tREP (where n is a natural number, and tCK may be one clock cycle) to compensate for another model delay value tREP, which may be a replica delay time. Specifically, the delay locked loop 10 includes a variable delay unit 11 configured to adjust a delay amount of the external clock EXTCLK (as a result, the delay amount is adjusted to n*tCK−tREP) in response to a phase detection signal PDET, a delay model unit 12 configured to delay the DLL clock DLLCLK for the model delay value tREF and generate a feedback clock FBCLK, and a phase comparison unit 13 configured to compare phases of the external clock EXTCLK and the feedback clock FBCLK and generate the phase detection sign PDET.

The delay amount calculation unit 20 is configured to subtract a code value of a counting code N, which is obtained by counting the delay amount (n*tCK−tREP)+(tREP), that is, n*tCK, of an output reset pulse signal OERST based on the external clock EXTCLK, from a code value of data output delay information CL and output the result of subtraction as a delay control code CL−N. Specifically, the delay amount calculation unit 20 includes a variable delay unit 21 configured to delay the output reset pulse signal OERST for n*tCK−tREP and a delay model unit 22 configured to delay the output reset pulse signal OERST for tREP in response to the phase detection signal PDET (the variable delay unit 21 and the delay model unit 22 may comprise a reset pulse delay unit, and the output signal of the reset pulse delay unit is defined as a delayed output reset pulse signal DOERST). The delay amount calculation unit 20 may also include a counter unit 23 configured to start counting in response to the output reset pulse signal OERST, finish the counting in response to the delayed output reset pulse signal DOERST in synchronization with the external clock EXTCLK, and generate a counting code N. Still further, the delay amount calculation unit 20 may also include a calculation unit 24 configured to subtract the code value of the counting code N from the code value having the data output delay information CL and output the result of subtraction as the delay control code CL−N.

The phase adjustment unit 30 is configured to receive and delay an internal read command IRDCMD for n*tCK−tREP, adjust the phase as many as the number of clocks of the DLL clock DLLCLK that corresponds to the delay control code CL−N, and output the phase-adjusted signal as an output enable flag signal OEFLAG. Specifically, the phase adjustment unit 30 includes a command receiver 31 configured to receive the external read command RD and generate an internal read command (hereinafter referred to as a "read command") IRDCMD, a variable delay unit 32 configured to delay the read command IRDCMD for n*tCK−tREP in response to the phase detection signal PDET and output the result of delay as a delayed read command DRDCMD, and a shift register 33 configured to adjust the phase of the delayed read command DRDCMD as many as the number of clocks of the DLL clock DLLCLK that corresponds to the delay control code CL−N.

As a result, the data output timing control circuit activates the output enable flag signal when the read command IRDCMD is delayed for (n*tCK−tREP)+(CL−N), that is, CL−tREF. The data is output to the outside when the data output path delay time tREP elapses after the output enable flag signal OEFLAG is activated, that is, when the time that is accurately as long as the data output delay information elapses after the external read command RD is applied.

Figure 2A:
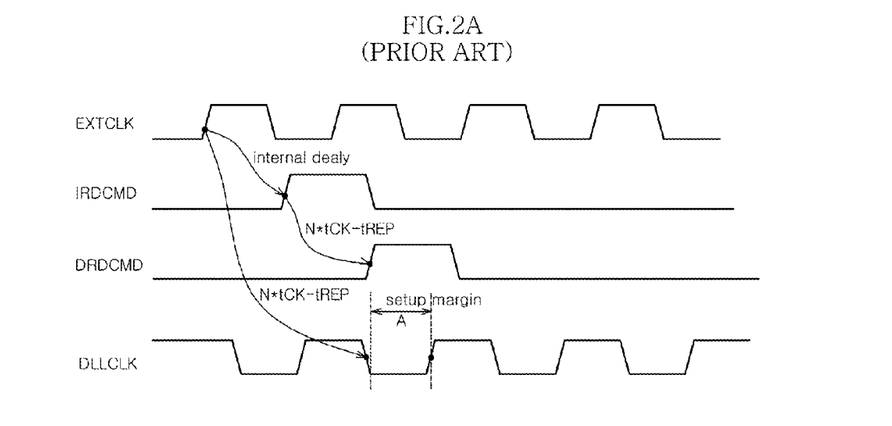
FIGS. 2A and 2B are signal waveform diagrams of the phase adjustment unit of FIG. 1.
Figure 2B:
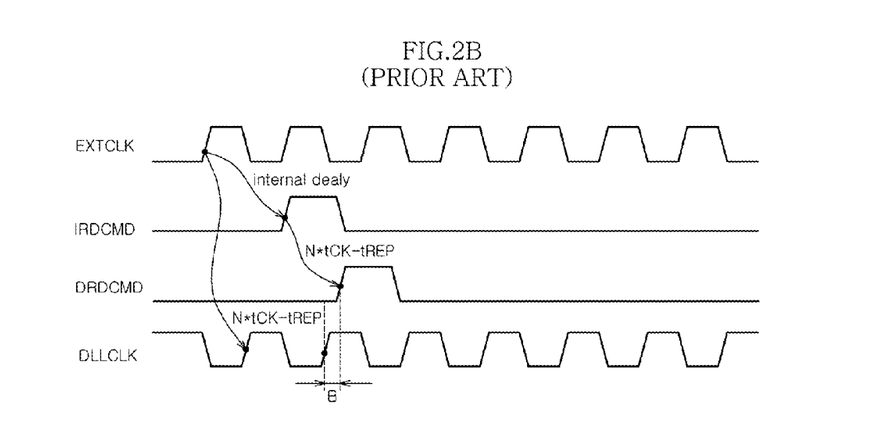

FIGS. 2A and 2B are diagrams showing signal waveforms of the phase adjustment unit 30.

FIG. 2A is a signal waveform diagram of the phase adjustment unit 30 that is normally operated. The external read command RD is applied through the command receiver 31 in synchronization with the external clock EXTCLK, but the read command IRDCMD that is internally used is a signal that is actually delayed for an amount as large as the internal delay amount. The variable delay unit 32 delays the read command for n*tCK−tREP.

Thereafter, the shift register 33 shifts the delayed read command DRDCMD in synchronization with the DLL clock DLLCLK. At this time, the delayed read command DRDCMD has a setup margin as large as A.

On the other hand, the clock frequency of the semiconductor apparatus is an index that indicates the data processing speed of the semiconductor apparatus, and modern technology has been developed in the direction in which the clock frequency gradually increases. FIG. 2B is a signal waveform diagram of an output timing control circuit of a semiconductor memory apparatus that uses a higher clock frequency than the signals shown in FIG. 2A.

FIG. 2B is a signal waveform diagram of the phase adjustment unit 30 of the output timing control circuit that uses a higher external clock frequency. FIG. 2B shows an example where the phase adjustment unit 30 may malfunction due to the high clock frequency.

As shown in FIG. 2A, the external read command RD is applied through the command receiver 31 in synchronization with the external clock EXTCLK, but the read command IRDCMD that is internally used is a signal that is actually delayed as large as the internal delay amount. The internal delay amount is equal to the value in FIG. 2A, but in this embodiment, it may be a relatively large value since the clock period is short. The variable delay unit 32 delays the read command IRDCMD for n*tCK−tREP.

Thereafter, the shift register 33 must shift the delayed read command DRDCMD in synchronization with the DLL clock DLLCLK, and in this case, since the delayed read command DRDCMD is generated to exceed the setup margin for a time period as large as B, the shift register 33 operates in synchronization with the DLL clock DLLCLK that is one period later than the set timing. Accordingly, the output enable flag signal OEFLAG is activated at a time point that is one period later than the set time point, and the data is output to the outside at a time point that is one period delayed from the set data output delay information CL. This causes malfunction of the whole semiconductor apparatus.

SUMMARY

In one embodiment of the present invention, a data output timing control circuit for a semiconductor apparatus includes: a phase adjustment unit configured to shift a phase of a read command by as much as a code value of a delay control code in sequential synchronization with a plurality of delayed clocks obtained by delaying an external clock by as much as predetermined delay amounts, respectively, delay the shifted read command by as much as the variable delay amount, and output a result of delay as an output enable flag signal.

In another embodiment of the present invention, a data output timing control circuit for a semiconductor apparatus includes: a delay amount calculation unit configured to subtract a code value of a counting code, which is obtained by counting the variable delay amount and a data output path delay amount based on an external clock that has been delayed as much as a variable delay amount, from a code value of data output delay information and output the result of subtraction as a delay control code; and a phase adjustment unit configured to receive and delay a read command by as much as the variable delay amount, shift a phase of a delayed read command by as much as a code value of the delay control code, and output the result of shift as an output enable flag signal, wherein the phase adjustment unit shifts the phase of the delayed read command by as much as the code value of the control code in sequential synchronization with a plurality of delayed clocks obtained by delaying a DLL clock by as much as predetermined delay amounts, respectively.

In still another embodiment of the present invention, a data output timing control circuit for a semiconductor apparatus includes: a clock adjustment unit configured to adjust an external clock by as much as predetermined delay amounts, respectively, and generate a plurality of delayed clocks; a shift register configured to shift a read command by as much as a code value of a delay control code in sequential synchronization with a first delayed clock to a second delayed clock, where from among the plurality of delayed clocks the first delayed clock is delayed a largest amount and the second delayed clock is delayed a smallest amount; and a variable delay unit configured to delay the shifted read command by as much as a variable delay amount and output the result of delay as an output enable flag signal.

BRIEF DESCRIPTION OF THE DRAWINGS

Features, aspects, and embodiments are described in conjunction with the attached drawings, in which.

DETAILED DESCRIPTION

Hereinafter, the present invention will be described in detail with reference to the accompanying drawings through example embodiments.

Figure 3:
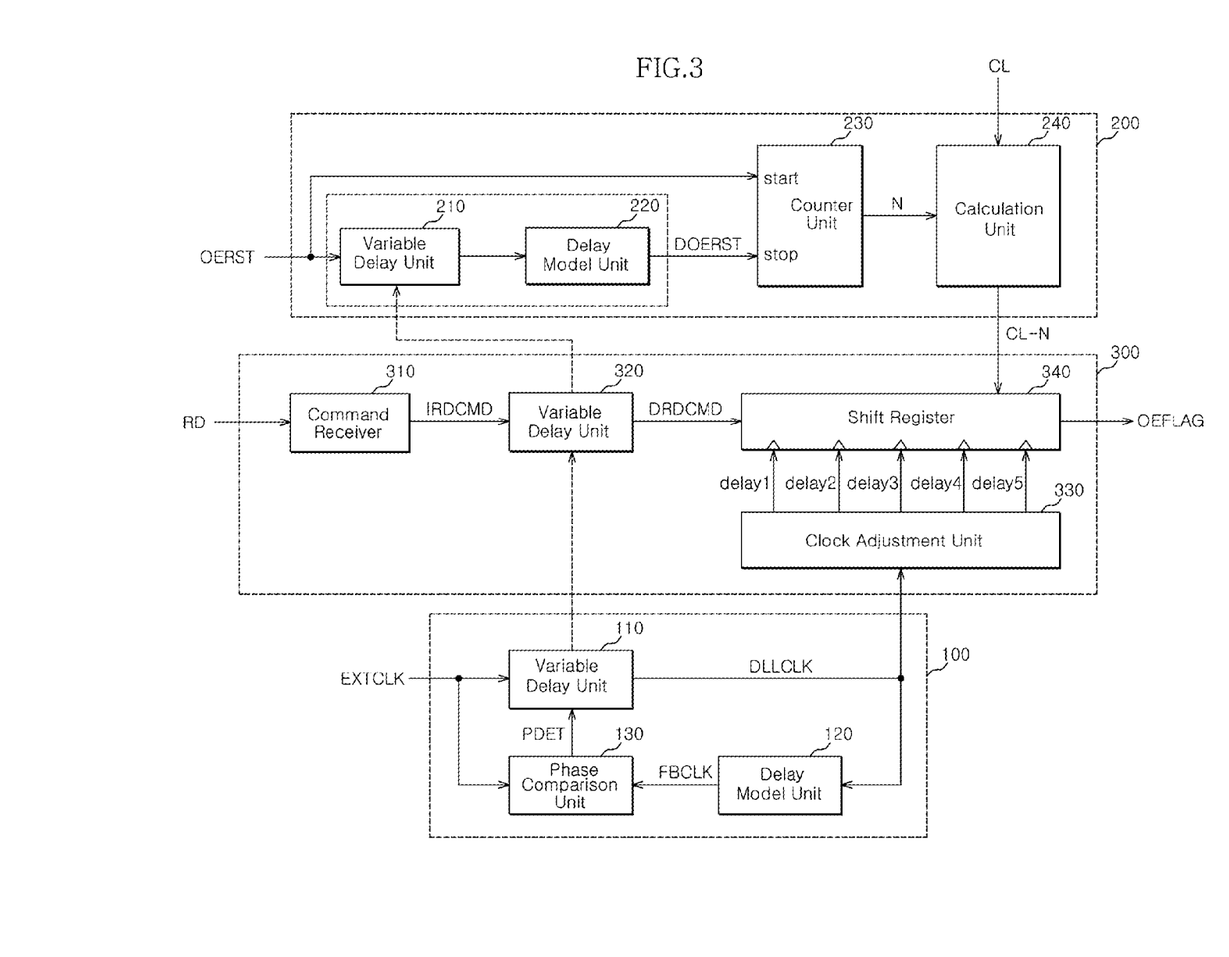
FIG. 3 is a block diagram of a data output timing control circuit for a semiconductor apparatus according to an embodiment of the present invention.

FIG. 3 is a block diagram of a data output timing control circuit for a semiconductor apparatus according to an embodiment of the present invention.

The data output timing control circuit shown in FIG. 3 includes a delay locked loop 100, a delay amount calculation unit 200, and a phase adjustment unit 300.

The delay locked loop 100 may be substantially similar to the delay locked loop 10 in the related art as shown in FIG. 1. That is, the delay locked loop 100 is configured to receive the external clock EXTCLK, and generate a DLL clock DLLCLK through the delay of the external clock for n*tCK−tREP to compensate for the model delay value tREP.

Specifically, the delay locked loop 100 includes a variable delay unit 110 configured to adjust a delay amount, which may be a variable delay amount, of the external clock EXT-CLK (as a result, the delay amount is adjusted to n*tCK−tREP) in response to a phase detection signal PDET. The lock loop 100 may also include a delay model unit 120 configured to delay the DLL clock DLLCLK for the model delay value tREF and generate a feedback clock FBCLK. Further, the delay locked loop 100 may include a phase comparison unit 130 configured to compare phases of the external clock EXT-CLK and the feedback clock FBCLK and generate the phase detection sign PDET.

The delay amount calculation unit 200 may be substantially similar to the delay amount calculation unit 20 in the related art as shown in FIG. 1. That is, the delay amount calculation unit 200 is configured to subtract a code value of a counting code N, which is obtained by counting the delay amount (n*tCK−tREP)+(tREP), that is, n*tCK, of an output reset pulse signal OERST based on the external clock EXT-CLK, from a code value of data output delay information CL and output the result of the subtraction as a delay control code CL–N.

Specifically, the delay amount calculation unit 200 includes a variable delay unit 210 configured to delay the output reset pulse signal OERST for n*tCK–tREP and a delay model unit 220 configured to delay the output reset pulse signal OERST for tREP in response to the phase detection signal PDET (the variable delay unit 210 and the delay model unit 220 may comprise a reset pulse delay unit, and the output signal of the reset pulse delay unit is defined as a delayed output reset pulse signal DOERST). The delay amount calculation unit 200 may also include a counter unit 230 configured to start counting in response to the output reset pulse signal OERST, finish the counting in response to the delayed output reset pulse signal DOERST in synchronization with the external clock EXTCLK, and generate a counting code N. The delay amount calculation unit 200 may further include a calculation unit 240 configured to subtract the code value of the counting code N from the code value having the data output delay information CL and output the result of subtraction as the delay control code CL–N.

The phase adjustment unit 300 includes a command receiver 310, a variable delay unit 320, a clock adjustment unit 330, and a shift register 340.

The command receiver 310 is configured to receive the external read command RD and output a read command IRDCMD for commanding a read operation in the semiconductor apparatus. An ideal command receiver 310 outputs the read command IRDCMD without phase delay from the external read command RD, but delay due to the internal delay amount may occur in an actual circuit.

The variable delay unit 320 may be configured to delay the read command IRDCMD in response to the phase detection signal PDET and output the delayed read command DRDCMD. The phase detection signal PDET is a clock that is activated until the phases of the external clock EXTCLK and the feedback clock have become equal to each other, and the delay amount of the variable delay unit 320 is adjusted to be n*tCK–tREP.

The clock adjustment unit 330 is configured to generate and provide clocks required to operate the shift register 340. The clock adjustment unit 330 may generate a plurality of delayed clocks delay1 to delay5 through adjustment of the DLL clock DLLCLK by as much as predetermined delay amounts. Further, the clock adjustment unit 330 provides the plurality of delayed clocks delay1 to delay5 to the shift register 340. The number of delayed clocks delay1 to delay5 may be variable, and any value may be appropriately set in the circuit.

The shift register 340 may be configured to shift the delayed read command DRDCMD by as much as a code value of a delay control code CL–N in sequential synchronization with the delayed clocks delay1 to delay5 provided from the clock adjustment unit 330. The shift register 340 may output the result of shift as an output enable flag signal OEFLAG. Specifically, the shift register 340 shifts the delayed read command DRDCMD by as much as the code value of the delay control code CL–N. The shift register 340 may shift the delayed read command DRDCMD in sequential synchronization with the delayed clock delay5 which may have a largest delay amount to the delayed clock delay1 which may have a smallest delay amount. That is, of the plurality of delayed clocks—delayed clock delay1 to delayed clock delay5—delayed clock delay5 may be delayed by the greatest amount, and delayed clock delay1 may be delayed the smallest amount. Thus, the shift register 340 may shift the delayed read command DRDCMD in sequential synchronization with the delayed clock delay5 which may delayed the most to delayed clock delay1 which may be delayed the least.

Figure 4:
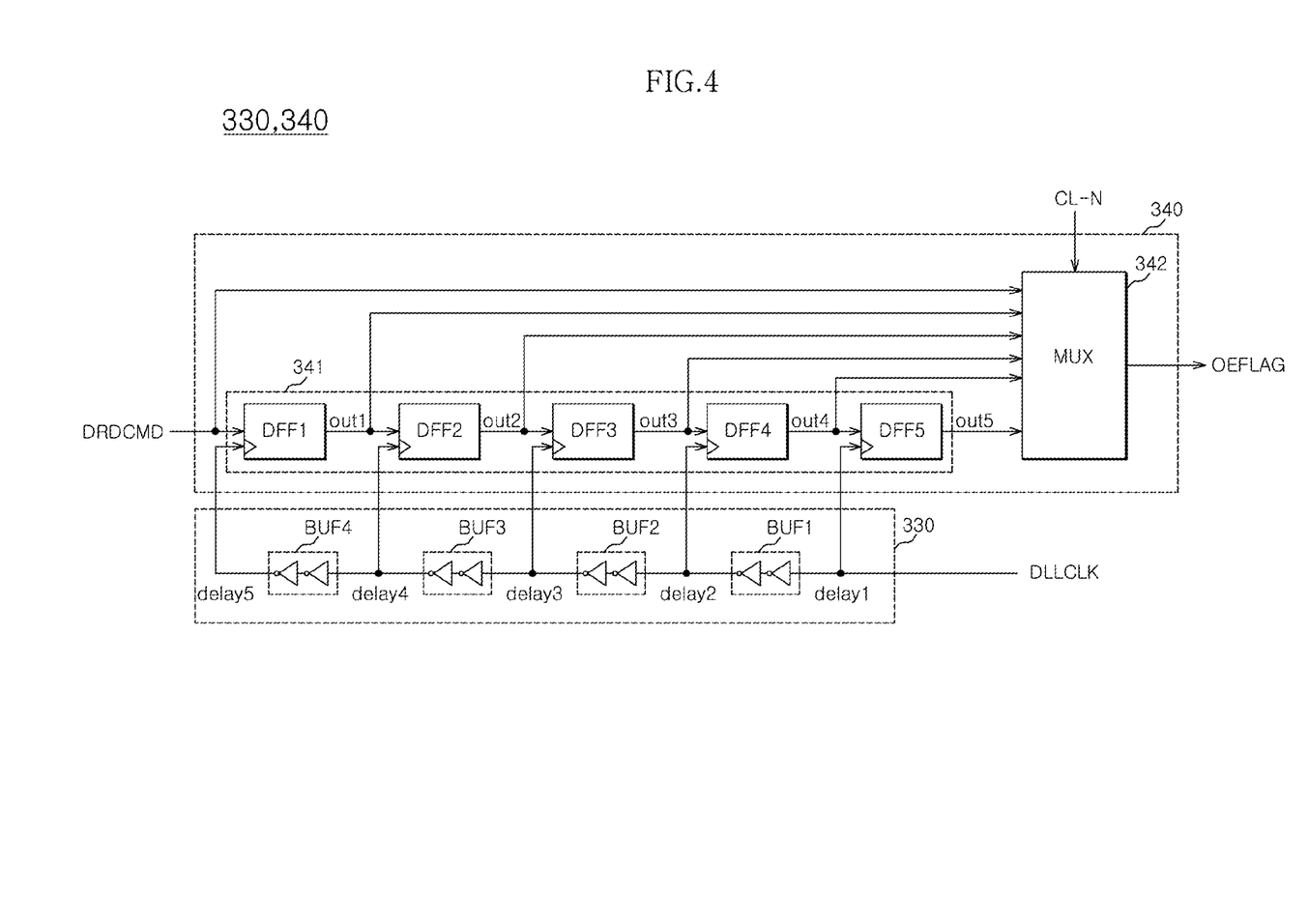
FIG. 4 is a circuit diagram illustrating the detailed configuration of the clock adjustment unit and the shift register of FIG. 3.

FIG. 4 is a circuit diagram illustrating a configuration of the clock adjustment unit 330 and the shift register 340.

The clock adjustment unit 330 includes a plurality of delay lines BUF1 to BUF4 connected in series. Each of the plurality of delayed clocks delay1 to delay5 may be a signal output from any one of the plurality of delay lines BUF1 to BUF4. For example, the first delayed clock delay1 may be a signal obtained by outputting the DLL clock DLLCLK as it is. The second delayed clock delay2 may be a signal obtained by delaying the first delayed clock delay1 for the first delay line BUF1. The third delayed clock delay3 may be a signal obtained by delaying the second delayed clock delay2 for the second delay line BUF2. The fourth delayed clock delay4 may be a signal obtained by delaying the third delayed clock delay3 for the third delay line BUF3. The fifth delayed clock delay5 may be a signal obtained by delaying the fourth delayed clock delay4 for the fourth delay line BUF4.

Accordingly, the fifth delayed clock delay5 may have a larger delay amount than the fourth delayed clock delay4, the fourth delayed clock delay4 may have a larger delay amount than the third delayed clock delay3, the third delayed clock delay3 may have a larger delay amount than the second delayed clock delay2, and the second delayed clock delay2 may have a larger delay amount than the first delayed clock delay1.

The shift register 340 includes a plurality of D flip-flops DFF1 to DFF5 connected in series. The plurality of D flip-flops DFF1 to DFF5 connected in series shift the phase of the delayed read command DFDCMD in sequential synchronization with the fifth delayed clock delay5 having the largest delay amount to the first delayed clock delay1 having the smallest delay amount.

A detailed operation of the shift register 340 will now be described. The first D flip-flop DFF1 shifts the delayed read command DRDCMD in synchronization with the fifth delayed clock delay5. The second D flip-flop DFF2 shifts an output out1 of the first D flip-flop DFF1 in synchronization with the fourth delayed clock delay4. The third D flip-flop DFF3 shifts an output out2 of the second D flip-flop DFF2 in synchronization with the third delayed clock delay3. The fourth D flip-flop DFF4 shifts an output out3 of the third D flip-flop DFF3 in synchronization with the second delayed clock delay2. The fifth D flip-flop DFF5 shifts an output out4 of the fourth D flip-flop DFF4 in synchronization with the first delayed clock delay1.

Accordingly, the delayed read command DRDCMD is delayed based on the delayed clocks delay1 to delay5 that have different phases in the respective shifting stages.

Because the code value of the delay control code CL–N may vary depending on system settings, the shift register 340 may further include a MUX 342 configured to select the delay amount of the delayed read command DRDCMD through the D flip-flops DFF1 to DFF5 in response to the code value of the delay control code CL–N.

Figure 5:
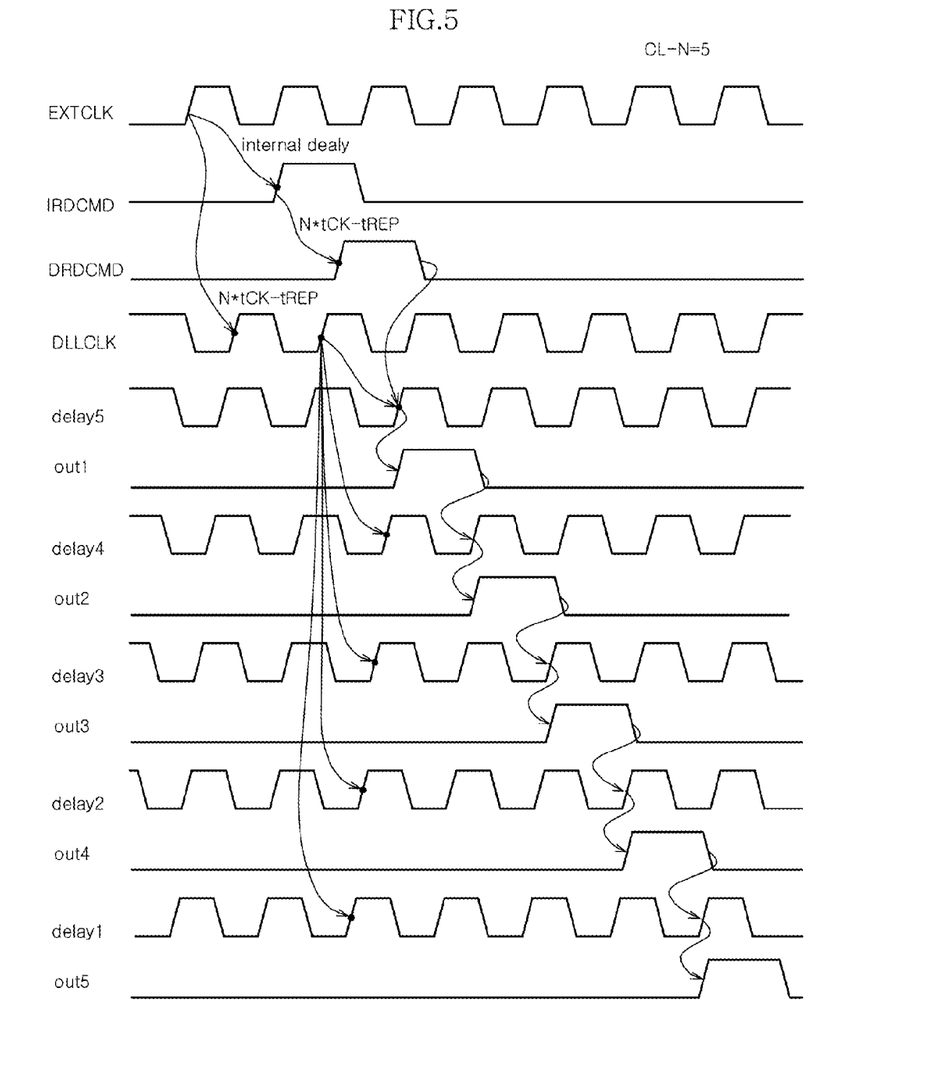
FIG. 5 is a signal waveform diagram in accordance with the data output timing control circuit of FIG. 3.

FIG. 5 is a waveform diagram in accordance with the data output timing control circuit for a semiconductor apparatus in accordance with an embodiment of the present invention.

First, it is assumed that the code value of the delay control code CL–N is set to 5.

If the external read command RD is applied in synchronization with the external clock EXTCLK that operates at a high frequency, the read command RD is delayed by as much as the internal delay amount, and the read command IRD- CMD is generated in the semiconductor apparatus. The read command IRDCMD is delayed for n*tCK−tREP by the variable delay unit 320 and is output as the delayed read command DRDCMD.

If the shift register 340 shifts the delayed read command DRDCMD in synchronization with the DLL clock DLLCLK, an error in the data output timing may be caused because there is no setup margin as described above. That is, if the delayed read command DRDCMD is shifted in synchronization with the DLL clock DLLCLK, the final output enable flag signal OEFLAG is delayed for one clock period to be activated.

According to the present invention, the delayed read command DRDCMD is shifted in synchronization with the plurality of delayed clocks delay1 to delay5 obtained by delaying the DLL clock DLLCLK for predetermined times. By delaying the delayed read command DRDCMD in sequential synchronization with the fifth delayed clock delay5 having the largest delay amount to the first delayed clock delay1 having the smallest delay amount, the last output signal out5 is output in synchronization with the DLL clock DLLCLK in the set timing. Accordingly, problems due to insufficient setup margin on the high-frequency clock condition can be solved.

Figure 6:
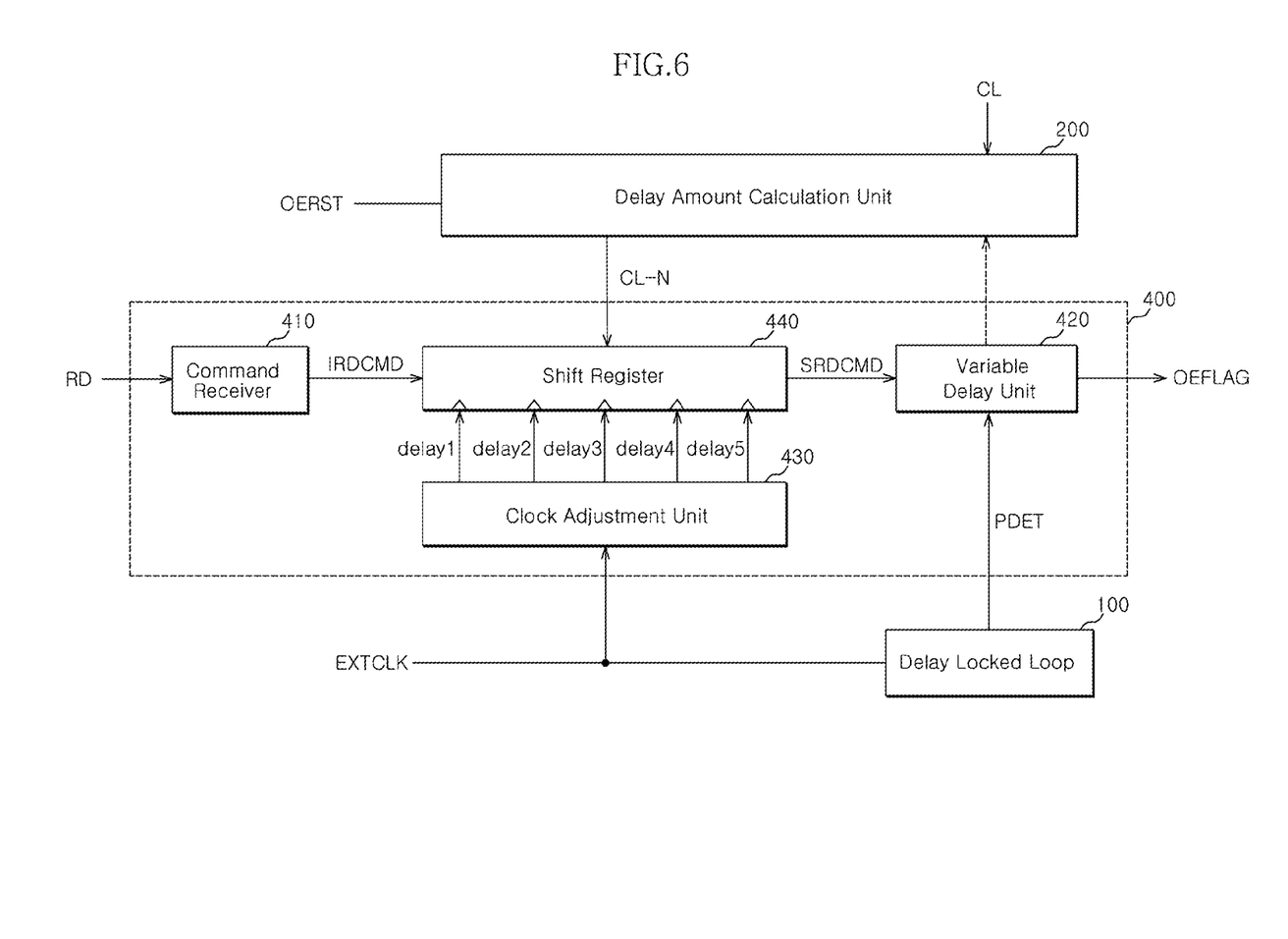
FIG. 6 is a block diagram of a data output timing control circuit for a semiconductor apparatus according to another embodiment of the present invention.

FIG. 6 is a block diagram of a data output timing control circuit for a semiconductor apparatus according to another embodiment of the present invention.

According to the data output timing in FIG. 3 as described above, the variable delay unit 320 first delays the read command IRDCMD, and then the shift register 340 shifts the delayed read command DRDCMD.

However, it is not always necessary to arrange the variable delay unit 320 and the shift register 340 in the above-described manner; the order of their arrangement may be changed. If the order of the arrangement of the variable delay unit 320 and the shift register 340 is changed, the shift register 340 may operate in synchronization with the external clock EXTCLK rather than the DLL clock DLLCLK. This is because the read command, of which the output path delay amount tREP has not been compensated for, is shifted.

The data output timing control circuit shown in FIG. 6 includes a delay locked loop 100, a delay amount calculation unit 200, and a phase adjustment unit 400.

The configuration and the operation of the delay locked loop 100 and the delay amount calculation unit 200 may be substantially similar those shown in FIG. 3.

The phase adjustment unit 400 includes a command receiver 410, a clock adjustment unit 430, a shift register 440, and a variable delay unit 420.

The command receiver 410 is configured to receive the external read command RD and output a read command IRDCMD for commanding a read operation in the semiconductor apparatus. As described above, an ideal command receiver 410 outputs the read command IRDCMD without phase delay from the external read command RD, but delay may occur due to an internal delay amount that may occur in an actual circuit.

The clock adjustment unit 430 is configured to generate and provide clocks required to operate the shift register 440, and the clock adjustment unit 430 generates a plurality of delayed clocks delay1 to delay5 by adjusting the external clock EXTCLK by as much as predetermined delay amounts. Further, the clock adjustment unit 430 provides the plurality of delayed clocks delay1 to delay5 to the shift register 440. The number of delayed clocks delay1 to delay5 is variable, and any value may be appropriately set in the circuit.

The shift register 440 is configured to shift the read command IRDCMD by as much as a code value of a delay control code CL−N. The shift register 440 may shift the read command IRDCMD in sequential synchronization with the delayed clocks delay1 to delay5 provided from the clock adjustment unit 430. The shift register 440 may output the result of shift as a shifted read command SRDCMD. Specifically, the shift register 440 shifts the read command RDCMD by as much as the code value of the delay control code CL−N in sequential synchronization with the delayed clock delay5 having the largest delay amount to the delayed clock delay1 having the smallest delay amount.

The detailed configuration of the clock adjustment unit 430 and the shift register 440 is substantially similar to the configuration of the clock adjustment unit 330 and the shift register 340, respectively, shown in FIG. 4. However, the configuration differs from the configuration shown in FIG. 4 in that the clock adjustment unit 430 outputs the delayed clocks delay1 to delay5 through delay of the external clock EXTCLK rather than the DLL clock DLLCLK, and the shift register 440 shifts the read command IRDCMD, which has not been delayed for n*tCK−tREP, to output the shifted read command SRDCMD.

The variable delay unit 420 outputs an output enable flag signal OEFLAG through delay of the shifted read command SRDCMD in response to the phase detection signal PDET applied from the delay locked loop 100. The detailed operation thereof is similar to that of the variable delay unit 320 shown in FIG. 3. Although the shifted read command SRDCMD is a signal synchronized with the external clock EXTCLK, the shifted read command SRDCMD has become a signal synchronized with the DLL clock DLLCLK through the variable delay unit 420.

As a result, because the data output timing control circuit shown in FIG. 6 makes the shift register 440 operate in synchronization with the phase-adjusted clock, like the circuit shown in FIG. 3, the setup margin can be ensured.

While certain embodiments have been described above, it will be understood by those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A data output timing control circuit for a semiconductor apparatus comprising:
    a delay amount calculation unit configured to subtract a code value of a counting code, which is obtained by counting a variable delay amount and a data output path delay amount based on an external clock that has been delayed as much as a variable delay amount, from a code value of data output delay information and output the result of subtraction as a delay control code; and
    a phase adjustment unit configured to receive and delay a read command by as much as the variable delay amount, shift a phase of a delayed read command by as much as a code value of the delay control code, and output the result of the shift as an output enable flag signal,
    wherein the phase adjustment unit shifts the phase of the delayed read command by as much as the code value of the control code in sequential synchronization with a plurality of delayed clocks obtained by delaying a delay locked loop (DLL) clock by as much as predetermined delay amounts, respectively.

2. The data output timing control circuit according to claim 1, wherein the variable delay amount is a value obtained by compensating for the data output path delay amount in n (n is a natural number) periods of the external clock.

3. The data output timing control circuit according to claim 1, wherein the delay amount calculation unit comprises:
a reset pulse delay unit configured to delay an output reset pulse signal for the variable delay amount and the data output path delay amount and generate a delayed output reset pulse signal;
a counter unit configured to start counting response to the output reset pulse signal and finish counting in response to the delayed output reset pulse signal, and generate the counting code; and
a calculation unit configured to subtract the code value of the counting code from the code value having the data output delay information and output a result of subtraction as the delay control code.

4. The data output timing control circuit according to claim 1, wherein the phase adjustment unit comprises:
a variable delay unit configured to delay the read command by as much as the variable delay amount and output the result of delay as the delayed read command;
a clock adjustment unit configured to adjust the DLL clock by as much as predetermined delay amounts, respectively, and generate the plurality of delayed clocks; and
a shift register configured to shift the delayed read command by as much as the code value of the delay control code in sequential synchronization with a first delayed clock to a second delayed clock, where from among the plurality of delayed clocks the first delayed clock is delayed a largest amount and the second delayed clock is delayed a smallest amount.

5. The data output timing control circuit according to claim 4, wherein the clock adjustment unit comprises a plurality of delay lines connected in series to delay the DLL clock, and each of the plurality of delayed clocks is a signal output from any one of the plurality of delay lines.

6. The data output timing control circuit according to claim 4, wherein the shift register comprises a plurality of D flip-flops connected in series to shift the delayed read command,
wherein the plurality of D flip-flops connected in series operate in sequential synchronization with the delayed clock having the largest delay amount to the delayed clock having the smallest delay amount.

7. The data output timing control circuit according to claim 6, wherein the shift register further comprises a MUX configured to select the shift amount of the delayed read command through the plurality of D flip-flops in response to the code value of the delay control code.

\* \* \* \* \*